United States Patent
Lee

(10) Patent No.: US 8,008,887 B2
(45) Date of Patent: Aug. 30, 2011

(54) METHOD AND DEVICE FOR RECHARGING USING PORTABLE MULTI-VOLTAGE SOLAR CELL

(75) Inventor: Man Geun Lee, Daejon (KR)

(73) Assignee: Soleitec Co., Ltd., Daejeon (KR)

( * ) Notice: Subject to any disclaimer, the term of this patent is extended or adjusted under 35 U.S.C. 154(b) by 1045 days.

(21) Appl. No.: 10/587,654

(22) PCT Filed: Feb. 20, 2004

(86) PCT No.: PCT/KR2004/000355
§ 371 (c)(1),
(2), (4) Date: May 21, 2007

(87) PCT Pub. No.: WO2005/074095
PCT Pub. Date: Aug. 11, 2005

(65) Prior Publication Data
US 2007/0222410 A1  Sep. 27, 2007

(30) Foreign Application Priority Data

Jan. 30, 2004  (KR) .................. 10-2004-0006324

(51) Int. Cl.
*H02J 7/00* (2006.01)
(52) U.S. Cl. ............. 320/101; 320/134; 320/141
(58) Field of Classification Search .......... 320/101, 320/107, 134, 140, 141, 158
See application file for complete search history.

(56) References Cited

U.S. PATENT DOCUMENTS

| | | | | |
|---|---|---|---|---|
| 5,725,006 A * | 3/1998 | Kawama et al. | ............... | 136/251 |
| 6,295,702 B1 * | 10/2001 | Bauer | ............................. | 24/303 |
| 6,909,259 B2 * | 6/2005 | Chung | ........................... | 320/107 |
| 2003/0094931 A1 * | 5/2003 | Renyolds | ...................... | 323/285 |
| 2003/0096642 A1 * | 5/2003 | Bessa et al. | .................... | 455/573 |

FOREIGN PATENT DOCUMENTS

| | | |
|---|---|---|
| JP | 08-308120 A | 11/1996 |
| JP | 10-341032 A | 12/1998 |
| KR | 2000-0019144 A | 4/2000 |
| KR | 20-0268947 Y1 | 3/2002 |
| KR | 2003-0053988 A | 7/2003 |

* cited by examiner

*Primary Examiner* — Edward Tso
*Assistant Examiner* — Aaron Piggush
(74) *Attorney, Agent, or Firm* — Venable LLP; Henry J. Daley

(57) ABSTRACT

A portable solar cell charger and methods of charging electronic devices using the same are disclosed. A portable solar cell charger comprises at least one solar cell plate holding a plurality of solar cells; a film with reformed surface formed on the solar cell plate; a power control part supplying a load side with power after perceiving a voltage required from the load side; and a case holding the solar cell plate and the power control part. A method of charging an electronic device using a solar cell charger comprises perceiving a voltage required from a load side using a microprocessor; converting the perceived voltage using D/A converter; comparing the converted voltage with a voltage from a solar cell plate; integrating signals from a comparator and a pulse generator; adjusting the voltage from the solar cell plate; and supplying the voltage from the solar cell plate into the load side.

19 Claims, 23 Drawing Sheets

One fold
(two solar cell plates)

Two folds
(three solar cell plates)

Three folds

Three folds

METHOD AND DEVICE FOR RECHARGING USING PORTABLE MULTI-VOLTAGE SOLAR CELL

TECHNICAL FIELD

The present invention relates to a portable solar cell charger and methods of electricity charging devices using the same and, more particularly, a portable multi-voltage charging device with solar cells, which can recharge storage batteries or provide emergency power to portable electronic devices, such as a cellular phone, a personal digital assistant (PDA), a mini disc (MD) player, a compact disc (CD) player, an MP3 player, a notebook computer, a digital camera, and a camcorder, using solar cells which help the storage batteries to be continuously recharged under the given light condition.

BACKGROUND ART

Electronic devices which are widely used as necessities or commodities in today, such as cellular phones, MP3 players, MD players, notebook computers, portable radios, digital cameras, and camcorders, are supplied with power from storage batteries or dry batteries. However, these batteries have to be recharged or exchanged into new ones after a definite period of time. A user has to have access to a power source or auxiliary power supply to recharge a storage battery, but he/she may not recharge the storage battery if he/she is remote from a power source or has no charger.

To solve such problems, portable solar cell electricity chargers have been developed. For example, the U.S. Pat. No. 5,898,932, Zurlo et al. (FIG. 1), and Korean Patent Publication No. 2003-0053988 (FIG. 2) disclose technologies of attaching directly a solar cell plate to the backside of a storage battery for a cellular phone. However, those approaches have a problem that the solar cell module attached to a cellular phone can be used for only the cellular phone and is not compatible with other portable electric devices.

The U.S. Pat. No. 5,522,943, Spencer et al. (FIG. 3) and U.S. Pat. No. 6,476,311, Lee et al. (FIG. 4) disclose a solar cell charger built in a separate portable case. However, such a solar cell charger built in the case may not supply enough power for electric devices because the surface area of the solar cell plate to absorb sunlight is narrower as portable electric devices become smaller and lighter. In addition, the solar cell charger built in a portable case has not presented a concrete technology for automatic voltage regulation to provide an adaptive voltage to diverse electric devices adopting a different power voltage respectively.

In the mean time, a conventional solar cell charger has no means to adjust and position the angle of a solar cell plate to absorb the available light in the most efficient fashion, i.e. aligning the solar cell plate perpendicular to the irradiating line of given light. Moreover, it is very difficult to provide the solar cell electricity charger with appropriate aligning & positioning structure in a mobile environment.

In addition, a charger has to have means of bipolar recharging operation, which enables a connecting terminal to freely change its polarities, because electronic devices with fixed polarity connecting terminal are very inconvenient to use in a mobile environment. However, the conventional solar cell charger requires polarity matching for recharging operation.

DISCLOSURE OF INVENTION

Accordingly, the present invention is directed to a portable charger using solar cells and methods of charging electronic devices using the same that substantially obviate one or more problems due to limitations and disadvantages of the related art.

An object of the present invention is to provide a portable multi-voltage solar cell charger and charging methods using the same, which can achieve high efficiency of charging, be attached to electronic devices so as to provide with combined or complex functions, and be manufactured in diverse types based on customer requirement, by employing solar cell plates with reformed surfaces to improve absorptivity by reducing reflection of sunlight, adopting a free-voltage charging method, and changing easily the polarities of the connecting terminal according to electronic devices to be charged.

Another object of the present invention is to provide a portable solar cell charger which has solar cell plates capable of being aligned at a right angle with irradiating line of sunlight and appropriate means so as to support itself while charging for movement out of doors, can easily change the polarities of the connecting terminal according to an electronic device to be charged, and can be kept in small size.

To achieve these objects and other advantages and in accordance with the purpose of the invention, as embodied and broadly described herein, this invention provides a portable multi-voltage solar cell charger, comprising:

at least a solar cell plate holding a plurality of solar cells which are molded and arranged in series/parallel;

a film formed on the surface of the solar cell plate, the film having a reformed surface to reduce reflection of sunlight on the surface of the solar cell plate;

a power control part supplying a load side with power generated from the solar cells after automatically perceiving a voltage required from the load side; and a case holding the solar cell plate and the power control part, the case combining at least one portable electronic device with a charging device.

In another aspect of the present invention, the present invention provides a method of charging using multi-voltage solar cell charger, comprising:

perceiving a voltage value required from a load side on a microprocessor by converting the voltage value using an analog-to-digital converter (hereinafter referred to as "A/D converter");

converting the voltage value perceived into a corresponding voltage value using a digital-to-analog converter (hereinafter referred to as "D/A converter") and comparing the converted voltage value with a voltage value from a solar cell plate using a comparator;

integrating a signal from the comparator and a signal from a pulse generator using an AND gate and adjusting the voltage from the solar cell plate based on the integrated signal; and supplying a voltage from the solar cell plate into the load side according to the adjusted voltage.

The surface of the solar cell plate in the portable charger according to the present invention is treated using polyethylene or polyurethane so that the surface is covered with small pyramid-shaped or inverted pyramid-shaped prominences or becomes rough as corroded. The treated surface prevents damage of the solar cells, reduces reflection of surface to improve light absorption rate, and, therefore, enhances the efficiency of a solar cell module. The solar cells are preferably made of silicon. In addition, the solar cells are molded by using a heat resistant polymer, ethylene vinyl acetate (hereinafter referred to as "EVA") resin so that the charger has a light weight and a thin thickness and is proof against external impact and shock.

The solar cell charger according to the present invention adjusts automatically a proper charging voltage for a load side after perceiving a voltage required from the load side using a control circuit comprising a microprocessor, electronic elements, and software, and transmits power for charging using PWM (pulse width modulation). Additionally, the charger according to the present invention can display a charging state of a second battery, i.e., the load side, by using an LED (Light Emitting Diode) or a buzzer as an indicator.

The portable solar cell charger according to the present invention can easily change the polarities of the connecting terminal from (+, −) to (−, +) by turning a gutter clockwise or counterclockwise by about 90° so as to be applied to portable electronics products with various types of connecting terminal. Moreover, the portable charger adopts a screw-type connection method to correspond with various types of connecting terminal.

The portable solar cell charger according to the present invention includes a connecting line which can be wound on the body of the charger thereby ensuring small size and convenient usage, and a connector as a connecting terminal to connect an electronics product with the charger. A case to endure the connecting line and the connector, functioning as a protective cover, can also be used as either a tweezer or a stand so that in the stationary state the charger with unfolded solar cell plates is supported by the case and for moving the charger is safely fixed on clothes, a hat or a bag.

Conventional solar cell chargers have failed to be commercialized as a portable product because they are inconvenient to carry or due to disfigurement. However, the portable solar cell charger according to the present invention overcomes these shortcomings in terms of design. For example, users can select one from chargers with various colored cases according to their taste. Particularly, by adopting the same color for the case of the charger and the solar cells, users may be attracted by a harmonized and beautiful appearance.

In addition, compared with conventional solar cell charging device providing only one function of charging, the solar cell charger according to the present invention can serve as a multifunction device. For example, a foldaway electronic product consisting of two sides may be manufactured. The one side of the foldaway electronic product may be a solar cell charger and the other side may be an electronic good such as an electronic organizer, an electronic entertainment machine, an MP3 player, a micro disc player or a mini recorder. In such a foldaway electronic product, the solar cell charger supplies directly power for the electronic good in the opposite side. In another embodiment, the solar cell charger may be attached to a purse or portable cosmetics case for women. By diversifying the functions of a charger, a user may take a portable multi-function electronic device with a solar cell charger always.

BRIEF DESCRIPTION OF THE DRAWINGS

Further objects and advantages of the invention can be more fully understood from the following detailed description taken in conjunction with the accompanying drawings, in which.

| <References> | |
|---|---|
| 1: solar cell plate | 1´: unit module |
| 2: solar cell | 3: gutter member |
| 4: support | 5: cover |
| 6: cover coupler | 7: stopper |
| 8: fixing member | 9: wire |
| 10: connecting member | 11: male screw |
| 12: female screw | 13: second connecting part |

BEST MODE FOR CARRYING OUT THE INVENTION

Reference will now be made in detail to the preferred embodiments of the present invention, examples of which are illustrated in the accompanying drawings.

Figure 1:
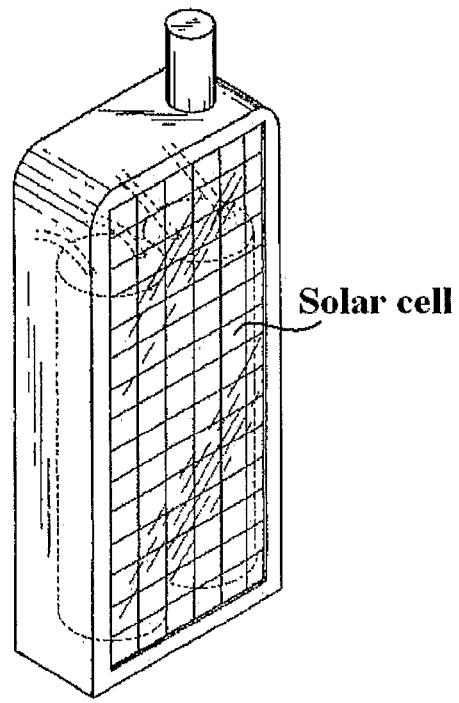
FIGS. 1 to 4 are portable solar cell chargers according to conventional technologies.
Figure 2:
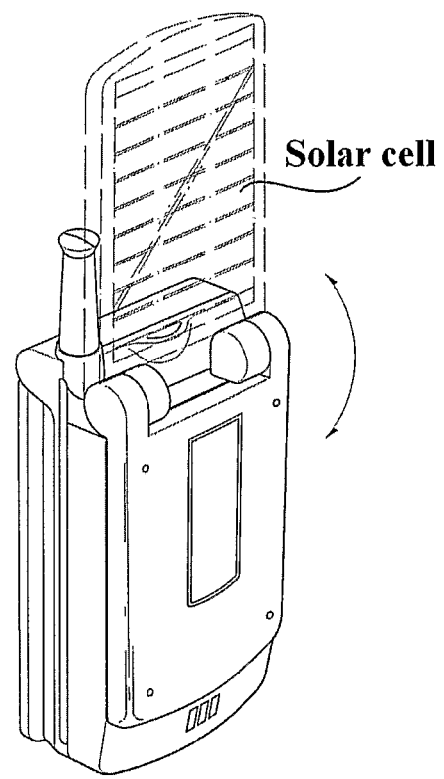
Figure 3:
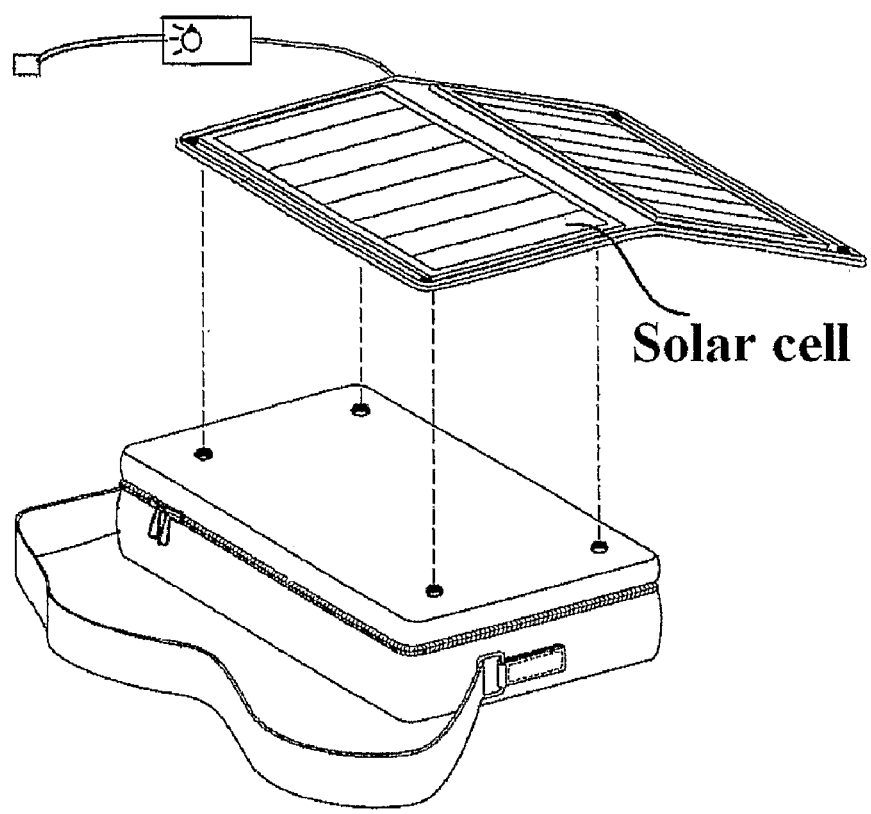
Figure 4:
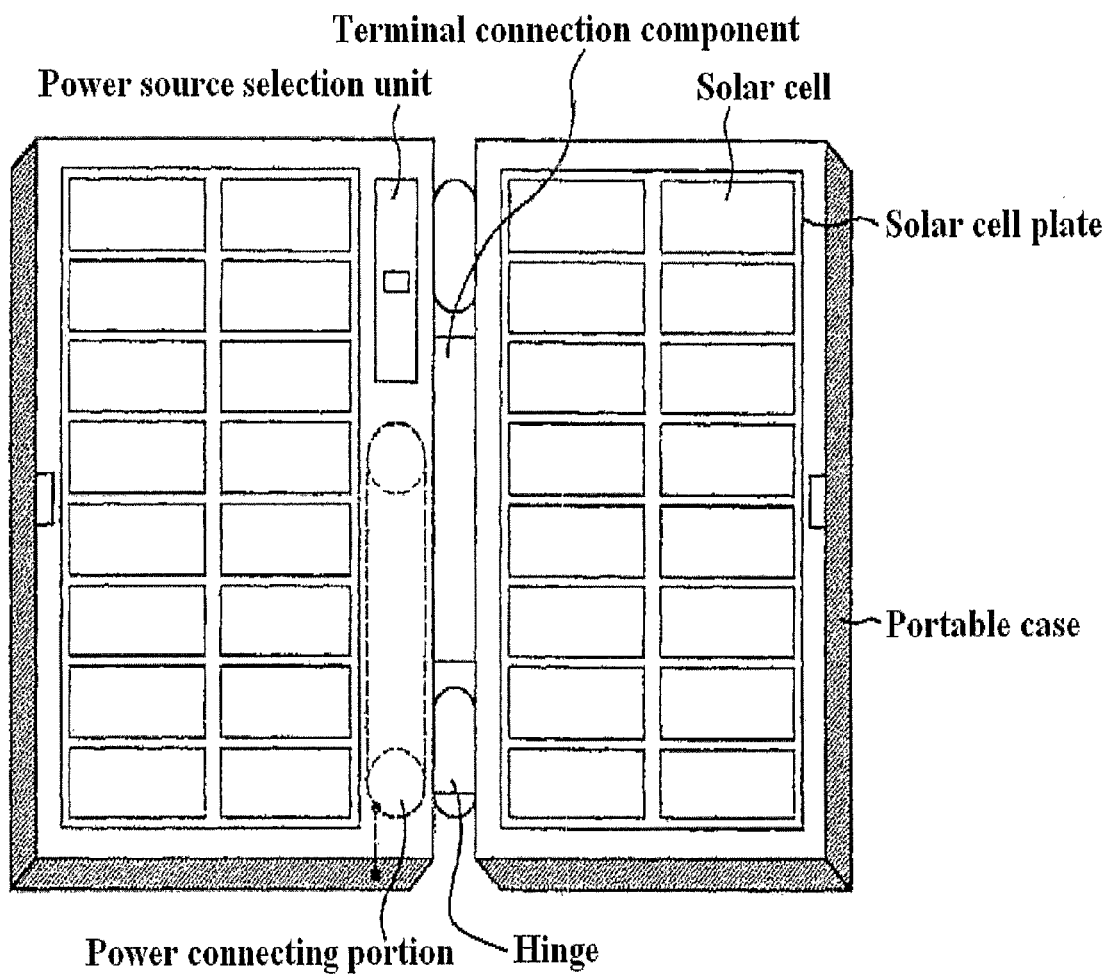
Figure 5:
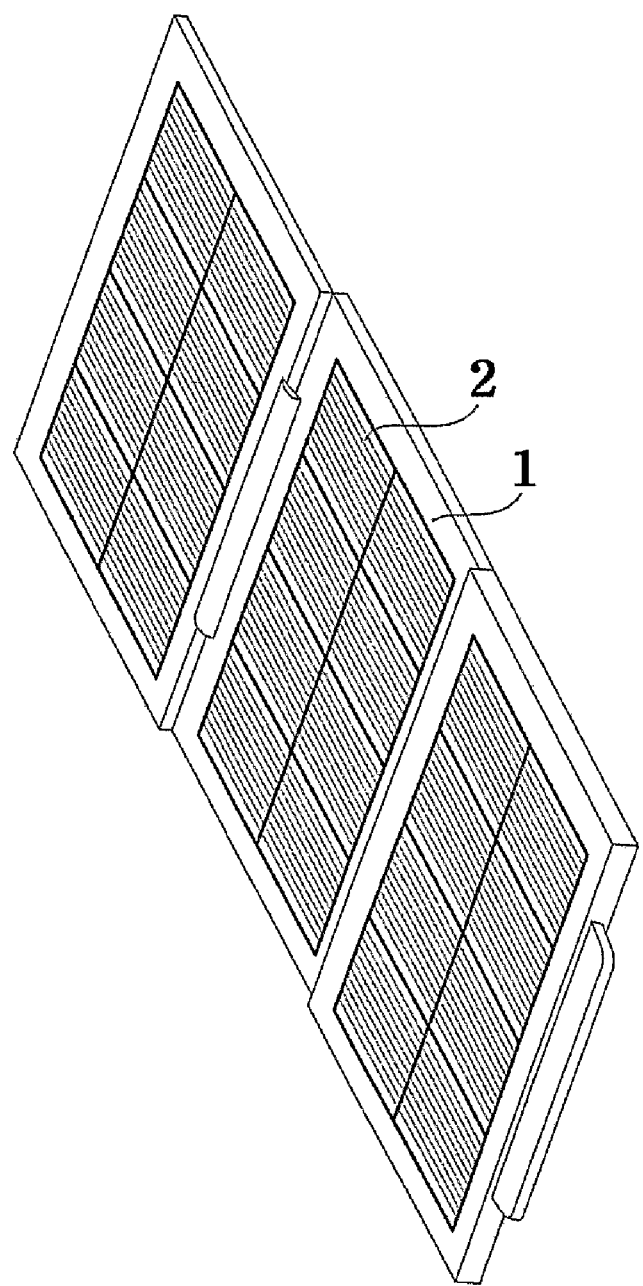
FIG. 5 is a schematic diagram of a solar cell charger according to an embodiment of the present invention.

FIG. 5 is a schematic diagram of a portable solar cell charger according to an embodiment of the present invention. As shown in FIG. 5, a portable solar cell charger comprises at least one solar cell plate (1) on which a plurality of solar cells (2) are arranged in parallel/series and molded; a power selection part to select at least one power voltage from various power voltages by selectively coupling positive poles and negative poles of the arranged solar cells (2); a power connection part to provide the selected power voltage with a portable electronic device; and a portable case.

Figure 6:
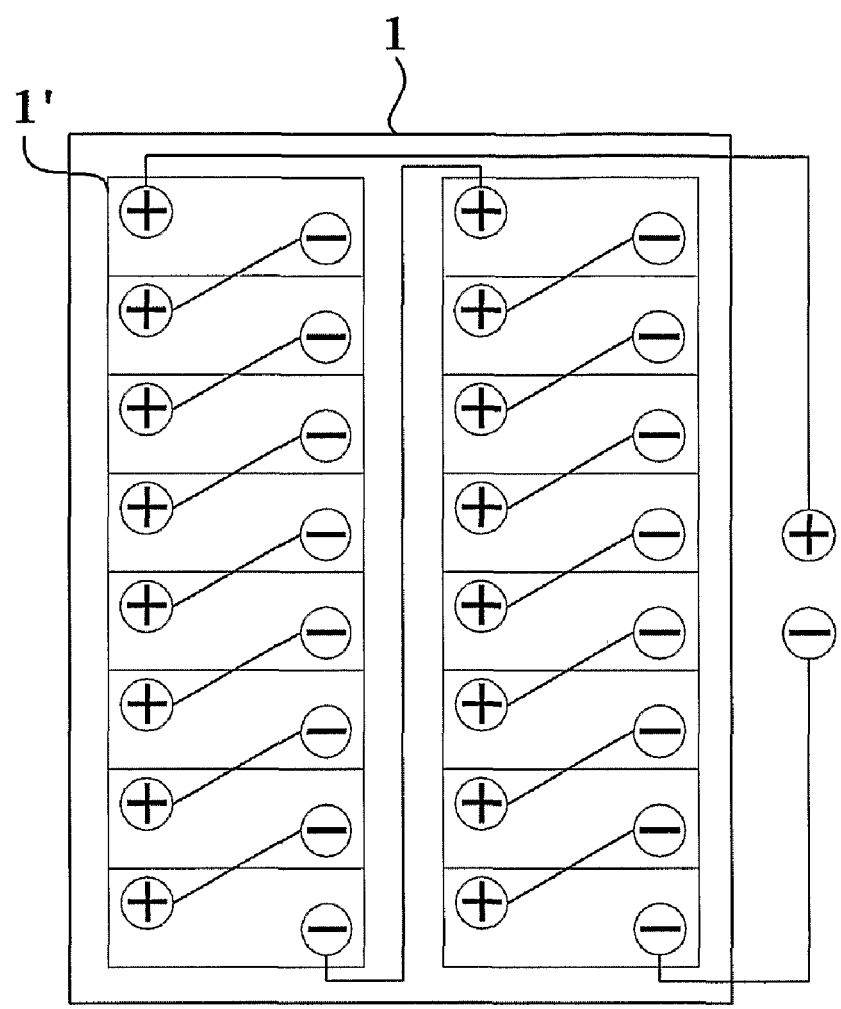
FIG. 6 is a schematic diagram illustrating polarity connection between solar cells according to the present invention.

FIG. 6 is a schematic diagram illustrating the structure of the solar cell plate (1) according to an embodiment of the present invention and shows polarity connection between solar cells (2) in more detail. As shown in FIG. 6, the solar cell plate (1) according to an embodiment of the present invention comprises two unit modules (1') which are connected with each other in series. The positive polarity and negative polarity of each unit module (1') are linked to contact points of the power selection part. In other words, one solar cell plate (1) is preferably constructed in series to generate sufficient power. The solar cell plate (1) may be constructed in parallel using a plurality of unit modules (1'). However, in that case, the solar cell plate cannot produce enough power and needs additionally a step-up circuit as well as a step-down circuit, thereby increasing the size of charger.

The solar cell (2) generally is formed of silicon as a semiconductor generating element to transform directly solar energy into direct current electric energy. One solar cell (2) generates an electromotive force between about 0.4 V and about 0.5 V. The generated electric current increases in proportion to strength of solar radiation and the area of the solar cell (2). The solar cell plate (1) generates a necessary amount of power using a plurality of solar cells (2) connected in series/parallel. The solar cell charger according to the present invention can charge a secondary battery even if power supply or auxiliary power is not available, and provide various voltages, for example, 1.2V, 2.4V, 3.6V, 4.8V, . . . , 12V, 24V, etc., according to voltage to be used for portable electronic devices.

For more convenient use, the solar cells (2) are packaged or modularized by using heat-resistant polymer, EVA resin, instead of glass after connection. Therefore, the solar cell module is light and small, and can endure physical impacts from outside.

Figure 7A:
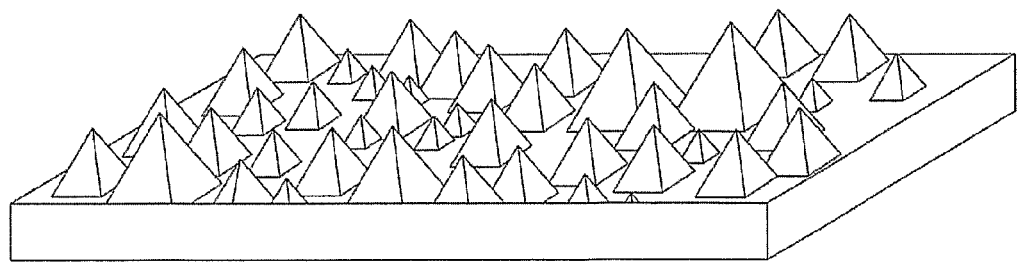
FIGS. 7a through 7c are examples of the reformed surface of a film on a solar cell plate.
Figure 7B:
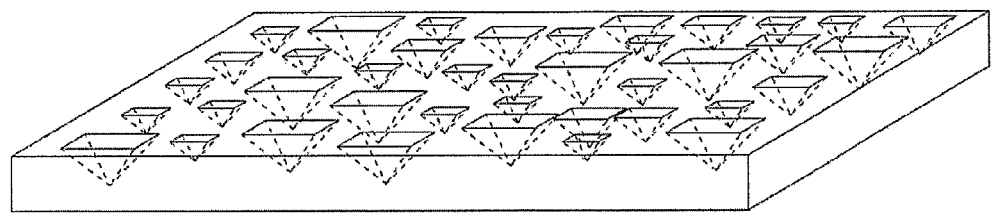
Figure 7C:
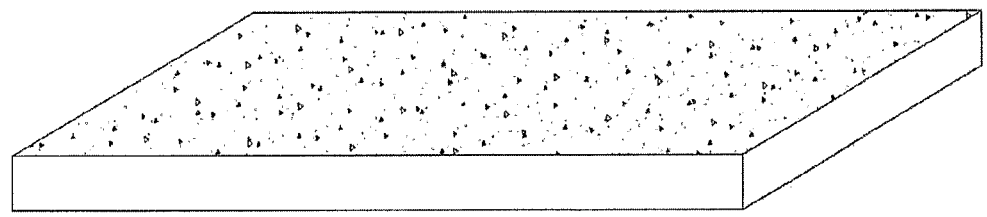

As shown in FIGS. 7a through 7c, when the solar cell plate is manufactured, the surface of the solar cell plate is protected by glass or polymer resin in order to prevent the solar cells against moisture and physical damages. The surface of the solar cell plate according to the present invention is covered with a polymer resin film such as polyethylene film or polyurethane film. The polymer resin film has a reformed surface on which pyramid-shaped (FIG. 7a) or inverted pyramid-shaped (FIG. 7b) prominence are formed, or which is rough as corroded (FIG. 7c) in order to reduce reflection of light and to improve absorptivity of light when light is irradiated onto the surface of the polymer resin film. The film with the reformed surface has higher absorptivity of light than that of a conventional glossy film to produce more electricity power under a given light condition.

Figure 8A:
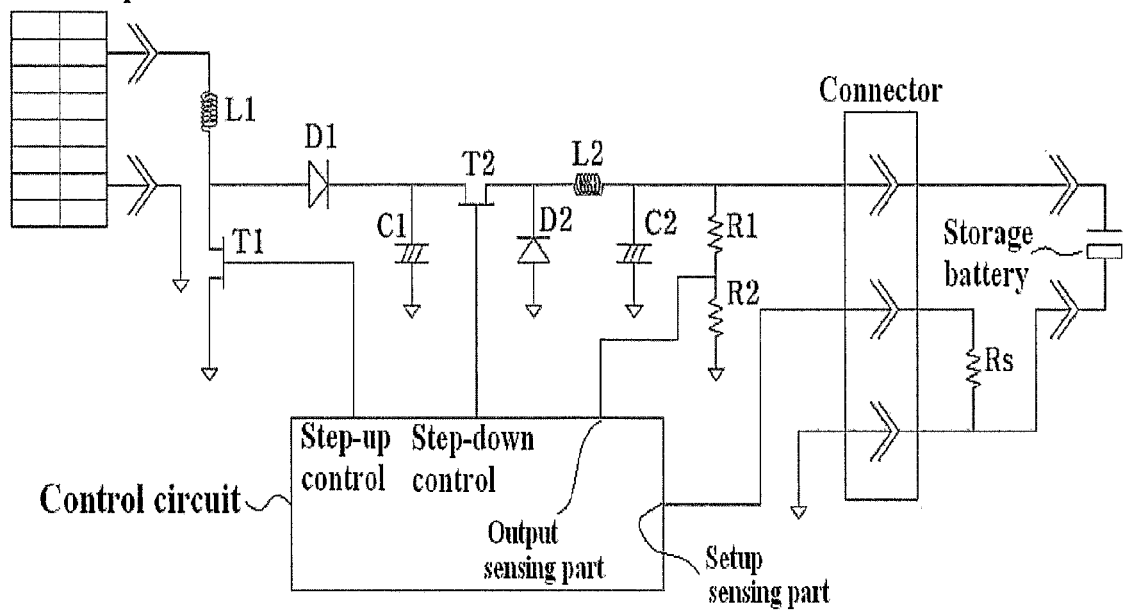
FIGS. 8a through 8c are schematic diagrams illustrating a power control part in accordance with the present invention.
Figure 8B:
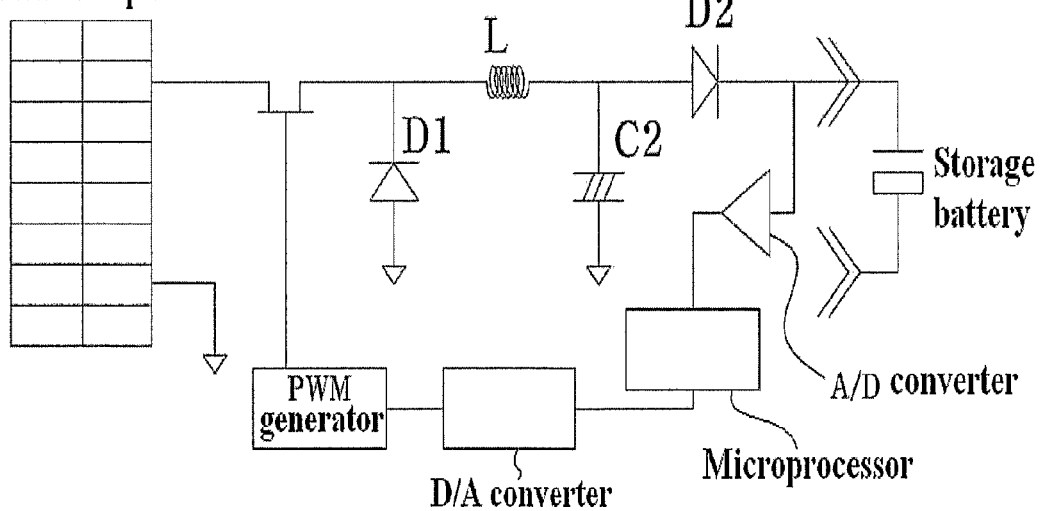
Figure 8C:
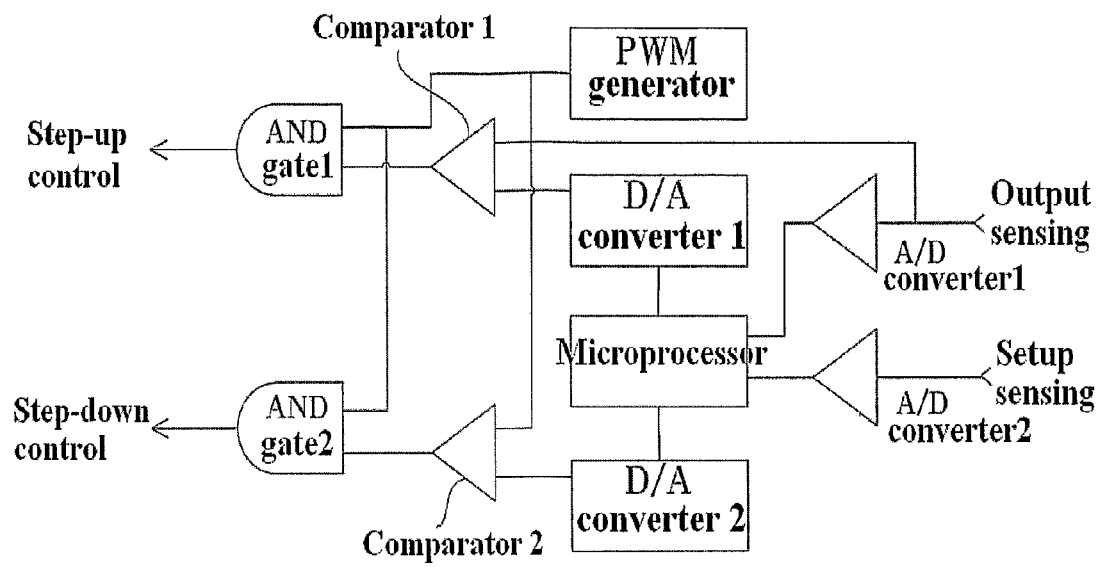

FIGS. 8a through 8c are schematic diagrams illustrating a power control part of a solar cell charger in accordance with the present invention. FIG. 8a shows a schematic diagram of a general power control part. FIG. 8b is a schematic diagram of a power control part providing step-down transformation according to an embodiment of the present invention. FIG. 8c is a block diagram to describe the function of a microprocessor.

The power control part is used to supply stable power for a load side, i.e., a portable electronic device utilizing direct current generated from the solar cells (2). Here, when a connecting terminal of a charger are coupled to outside connectors of the load side, the power control part first perceives a voltage to be applied to a storage battery of the load side. Then, the power control part determines an appropriate charge voltage for the storage battery and supplies power for the load side using a PWM method. Accordingly, by automatically perceiving an appropriate voltage for an electronic device to be used and determining a charge voltage to supply power for the electronic device, the solar cell charger according to the present invention is available for most of portable electronics products using direct current power.

The power control part comprises a step-up switching regulator and a step-down switching regulator. In detail, the step-up switching regulator comprises an n-channel field effect transistor (FET, T1), an inductor 1 (L1), and an electrolytic condenser 1 (C1). The step-down switching regulator comprises a p-channel FET (T2), inductor 2 (L2), and an electrolytic condenser 2 (C2). For step-up control, T2 is turned on, and L2 and C2 are used as output filters. For step-down control, T1 is turned off, and L1, schottky diode (D1), and C1 are used as input filters. An output voltage is determined from the value of resistance Rs embedded in the 3-terminal outside connector of the load side, wherein the value of Rs is perceived by a microprocessor.

The microprocessor perceives the value of Rs through an A/D converter connected to a set detector. Referring to FIG. 8c, in case of step-up control, after a D/A converter 2 is regulated so that T2 is turned on, a D/A converter 1 outputs a corresponding voltage value. Then, a PWM control is performed at a comparator 1 and the corresponding voltage is outputted. In case of step-down control, after the D/A converter 1 is regulated so that T1 is turned off, the D/A converter 2 outputs a corresponding voltage value. Then, a PWM control is performed at a comparator 2 and the corresponding voltage is outputted.

In case of an automatic charging mode, after the voltage of a second storage battery of a load side is perceived by the A/D converter 1, a corresponding charging voltage is outputted by means of step-up or step-down control. The charging state of the second storage battery is continuously checked by the A/D converter 1. When the charging is completed, the charging process is finished by controlling the D/A converter.

Depending on a device configuration, the power control part may comprise only a step-up member or step-down member. Referring to FIG. 8a, when a charger comprises only step-up member by minimizing the number of solar cells (2), L2 and C2 are removed. When a charger comprises only step-down member by increasing the number of solar cells (2), T1, L1 and C1 are removed.

An indicator, such as an LED (light emitting diode) or a buzzer, continuously emits light or sounds when the solar cell charger is in the condition of supplying power for a load side under the circumstance of sufficient solar radiation. The LED makes flicker and the buzzer becomes silent while charging is conducted. After the charging is completed, the LED or buzzer emits light or sounds again.

In addition, T2 may be turned off so as to intercept output for safety when connection to Rs is failed or unstable. Therefore, the charger can be protected from an inverse current that a current flows from a second storage battery of the load side to the solar cells (2) as a power generation part.

Figure 9:
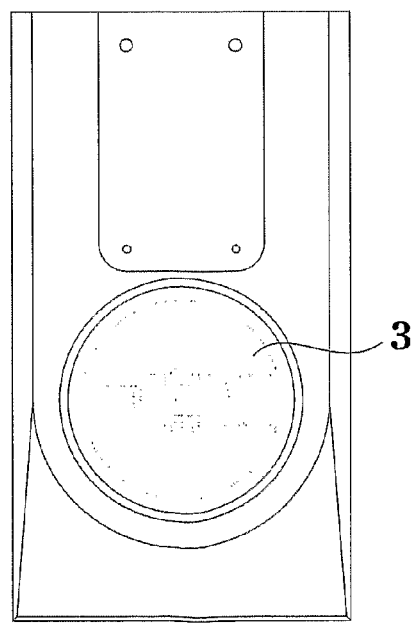
FIG. 9 is a schematic diagram showing a gutter member mounted on a portable case in accordance with the present invention.

FIG. 9 shows a gutter member mounted on a portable case in which a connecting wire and connecting terminal are stored. Referring to FIG. 9, the connecting wire connected to an output terminal of the power control part is wound around the gutter member (3) manually or semi-automatically and stored. The connecting terminal coupled to another end of the connecting wire is fixed and stored in a hollow formed on a disc of the gutter member (3). Therefore, a user doesn't need to carry a separate connecting wire and connecting terminal because the charger can hold the connecting wire and the connecting terminal within itself. On occasion, the gutter member (3) can be easily replaced with another one. If a particular connecting terminal is required, a user may easily replace the gutter member with a new one having a disc on which a hollow suitable for the particular connecting terminal is formed. In addition, the connecting wire and connecting terminal may be protected from damages due to exposure outside during movement or storage by using a support as a protection cover (5).

Figure 10A:
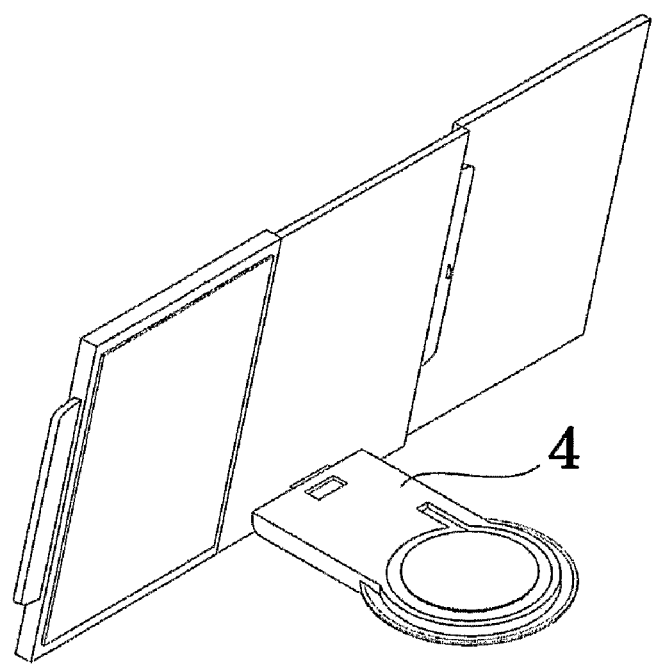
FIGS. 10a and 10b are schematic diagrams showing a support mounted on a portable case in accordance with the present invention.
Figure 10B:
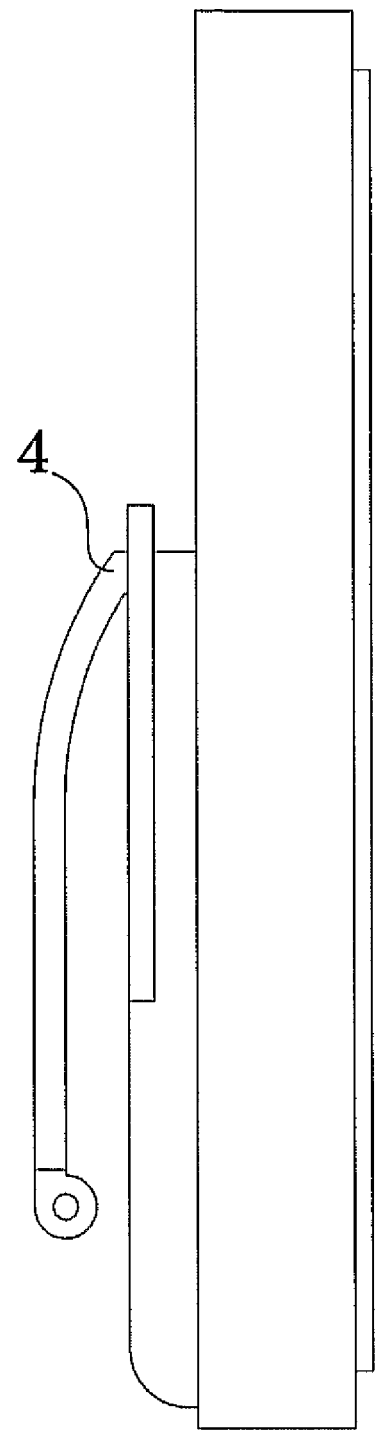

FIGS. 10*a* and 10*b* show a support (4) which is used to stably bolster the solar cell charger for charging. Referring to FIG. 10*a*, the support (4) is unfolded to hold the solar cell plate (1) toward incoming light such as sunlight when the solar cell charger is working under a still condition. Referring to FIG. 10*b*, when the solar cell charger is charged while a user moves with the solar cell charger, the support (4) may be used as a pin to fix the charger to his/her clothes, hat or bag so that the surface of the solar cell plate (1) can be exposed to the light source.

Figure 11:
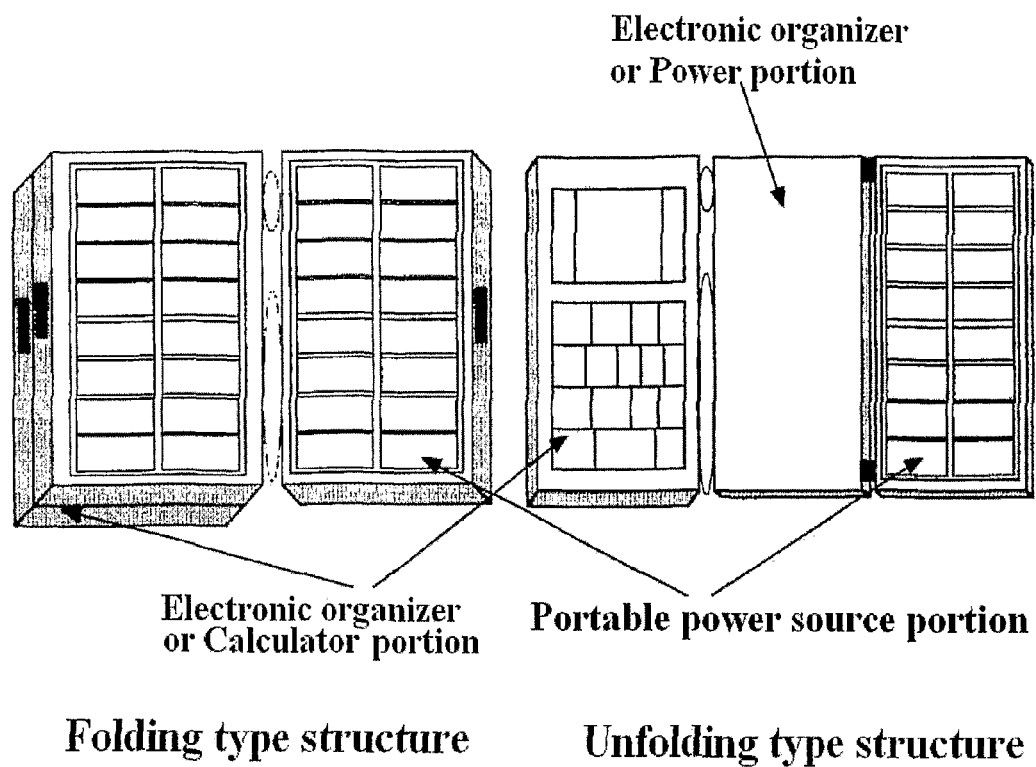
FIGS. 11 and 12 are examples of a complex electronic product comprising a solar cell charger and at least one portable electric device.

FIG. 11 shows examples of an integrated complex electronic product comprising a solar cell charger and at least one a portable electronic device. Here, the solar cell charger supplies electric power for the portable electronic device. The electronic device, which can be integrated with the solar cell charger, includes an electronic organizer, an electronic game, an MD, an MP3 player, a digital camera, a radio, a cellular phone, a PDA, a portable recorder, a notebook computer, and so on.

Figure 12:
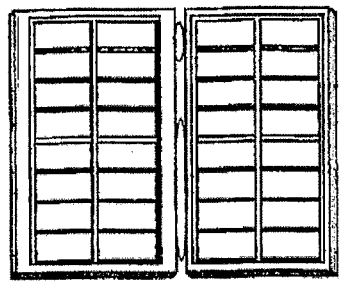
Figure 12:
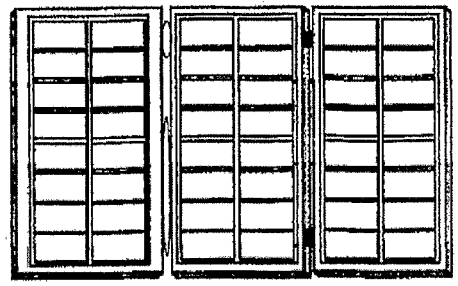
Figure 12:
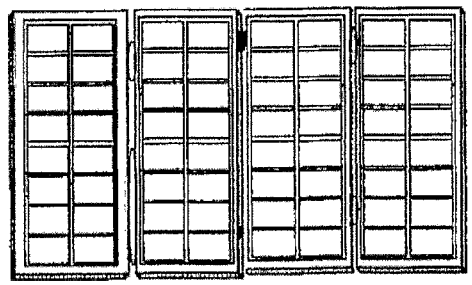
Figure 12:
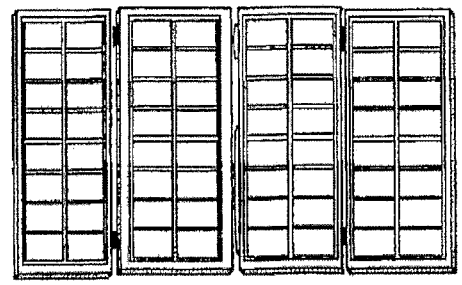

FIG. 12 is examples of an integrated complex electronic product comprising a solar cell charger and at least one portable electric device according to another embodiment of the present invention. As shown in FIG. 12, a portable case for the integrated complex electronic product may have diverse solar cell plate structures such as one fold, two folds, three folds, four folds, etc.

Figure 13:
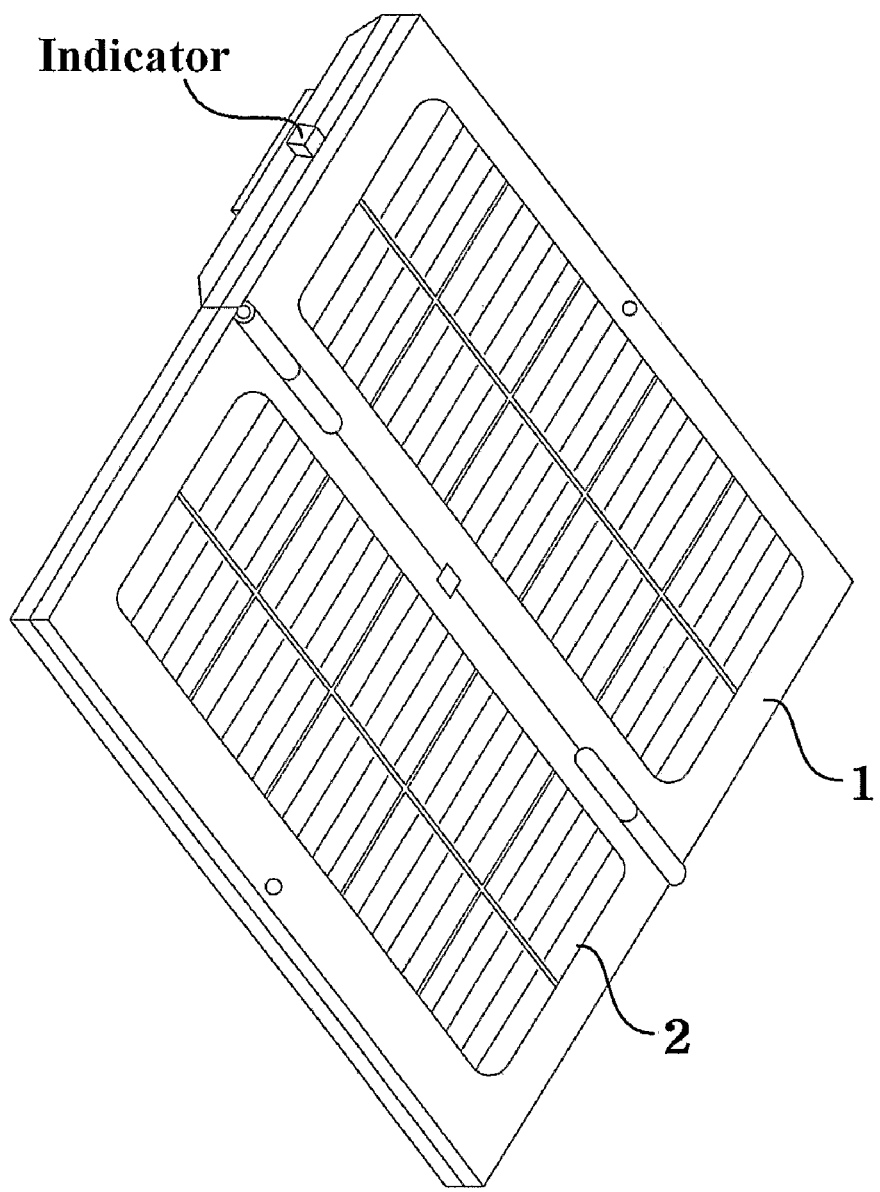
FIG. 13 is a perspective view illustrating a portable solar cell charger in accordance with another embodiment of the present invention.

FIG. 13 is a perspective view of a portable solar cell charger according to the present invention. As shown in FIG. 13, the solar cell charger comprises two solar cell plates (1) with a plurality of solar cells (2). The portable solar cell charger has a magnetic means so that the case is not open when the solar cell charger is folded and stored. Therefore, the solar cell plates are prevented from damage.

Figure 14:
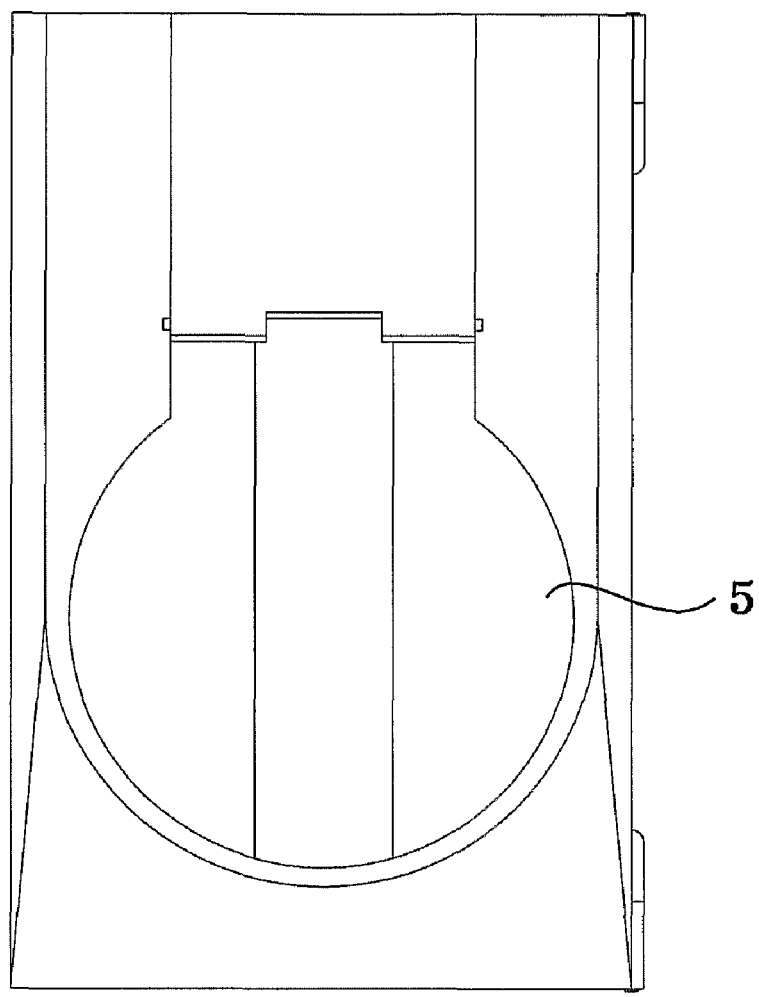
FIG. 14 is a rear view of a portable solar cell charger in accordance with another embodiment of the present invention.

FIG. 14 is a rear view of a portable solar cell charger in accordance with another embodiment of the present invention. Referring to FIG. 14, a cover (5) is formed on the center of the back of the solar cell charger. The cover (5) is used as a support to stand up the charger for charging. Thus, the solar cell plate (1) of the charger can be positioned at nearly right angle with a normal line to the surface of the sun.

Figure 15:
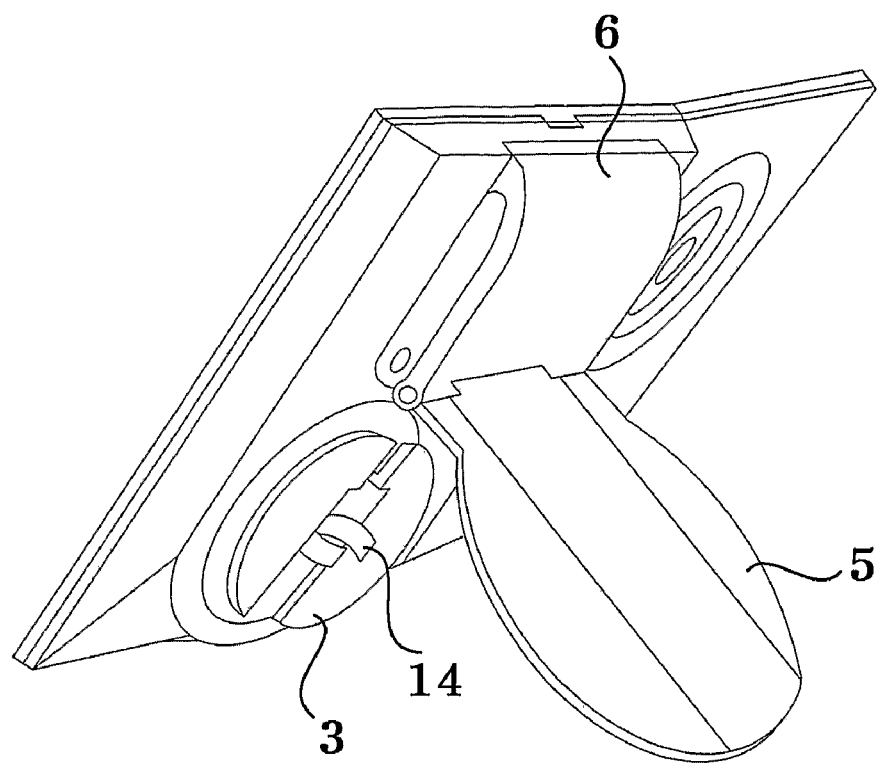
FIG. 15 is a rear-perspective view of a portable solar cell charger in accordance with another embodiment of the present invention.

FIG. 15 is a rear-perspective view of a portable solar cell charger in accordance with another embodiment of the present invention. As shown in FIG. 15, the cover (5) is unfolded to support the solar cell charger for charging.

Figure 16:
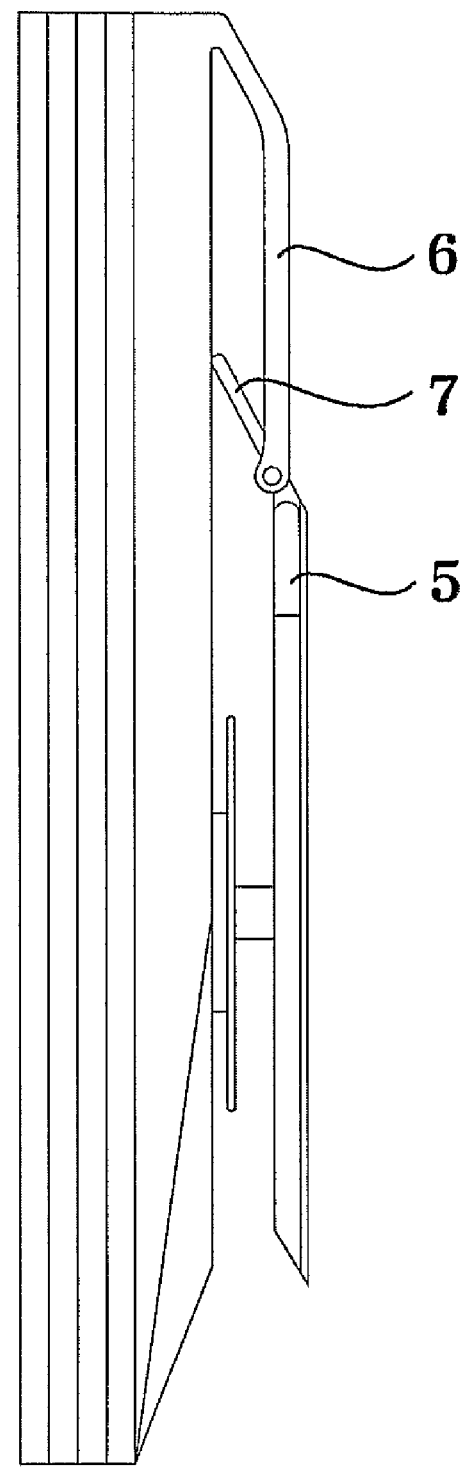
FIGS. 16, 17a and 17b are side views of a portable solar cell charger in accordance with another embodiment of the present invention.
Figure 17A:
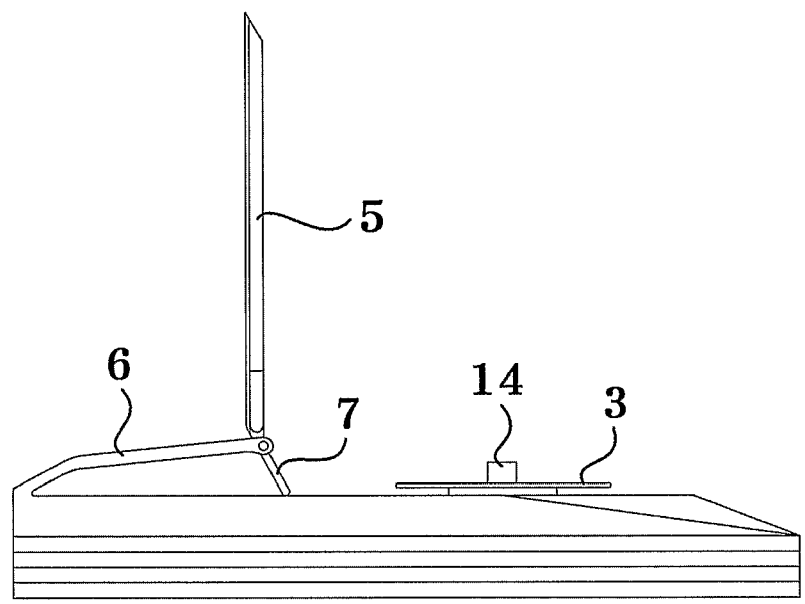
Figure 17B:
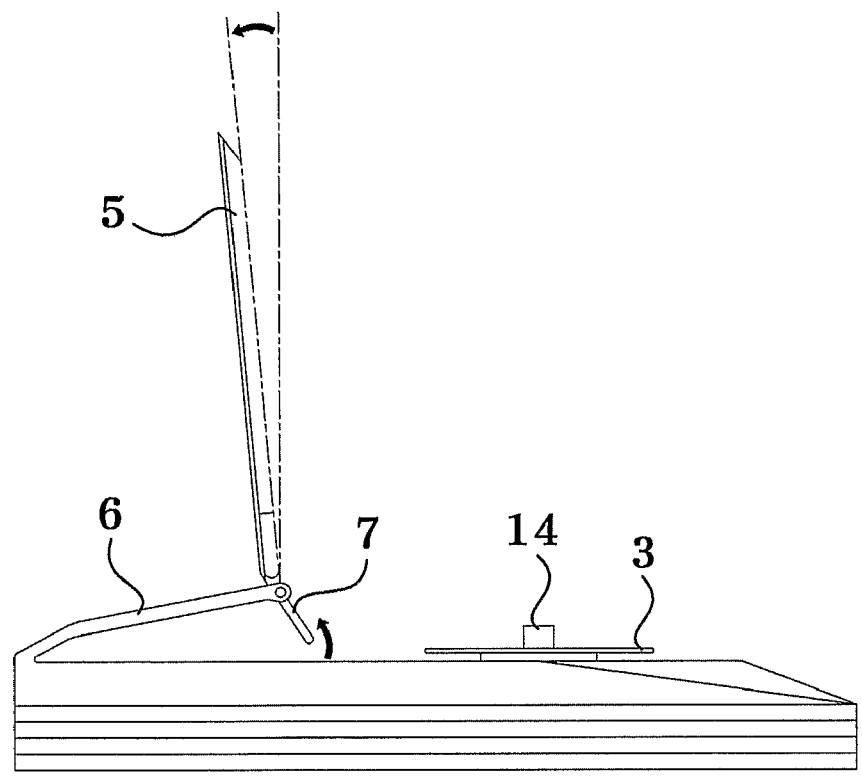

FIG. 16 is a side view of a portable solar cell charger in accordance with another embodiment of the present invention. As shown in FIG. 16, a stopper (7) is installed on an end of the cover (5) and is connected to a cover coupler (6). FIGS. 17*a* and 17*b* are side views of the charger illustrating the unfolded cover (5). The stopper (7) upholds the cover (5) with elasticity of a cover coupler (6). The stopper (7) may be used as a means to attach the charger to another object when charging is performed for outdoor movement. As shown FIG. 17*b*, the cover (5) is unfolded so as to widen the space between the stopper (7) and the back of the charger. An object such as a bag or clothes is held between the stopper (4) and the back of the charger. Therefore, the charger can be stably fixed to the object during charging.

Figure 18:
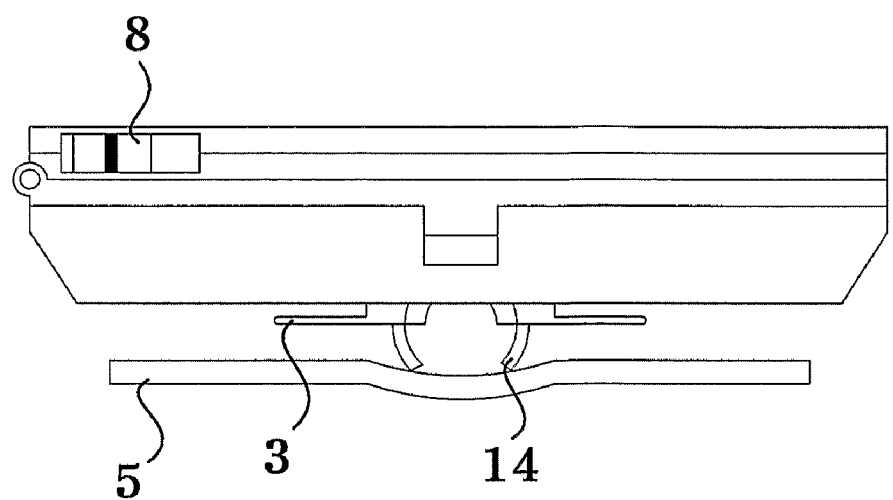
FIG. 18 is a bottom view of a portable solar cell charger in accordance with another embodiment of the present invention.

FIG. 18 is a bottom view of a portable solar cell charger in accordance with another embodiment of the present invention. As shown in FIG. 18, a fixing member (8) is formed on the undersurface of the charger. By using the fixing member (8), the solar cell plate (8), which is unfolded for charging, is reliably kept in the unfolded state. Particularly, the fixing member (8) prevents the shaking of the solar cell plate (8) when charging is performed for movement outdoors. The fixing member (8) may be formed on a plane of the charger as well as the undersurface.

Figure 19:
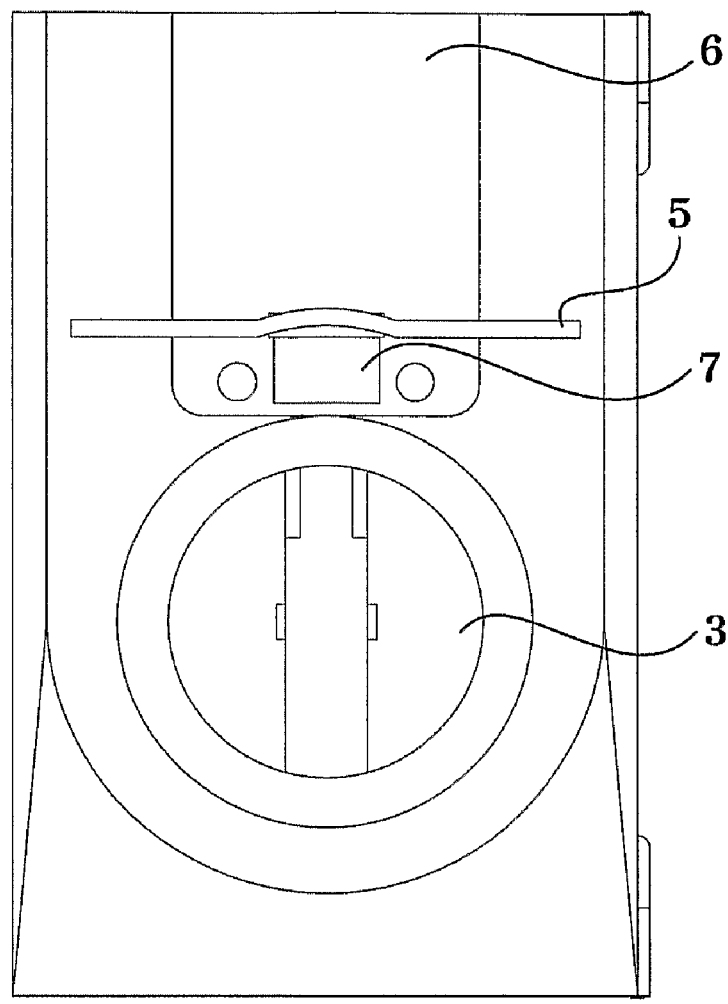
FIG. 19 is a rear view of a portable solar cell charger in accordance with another embodiment of the present invention.
Figure 20:
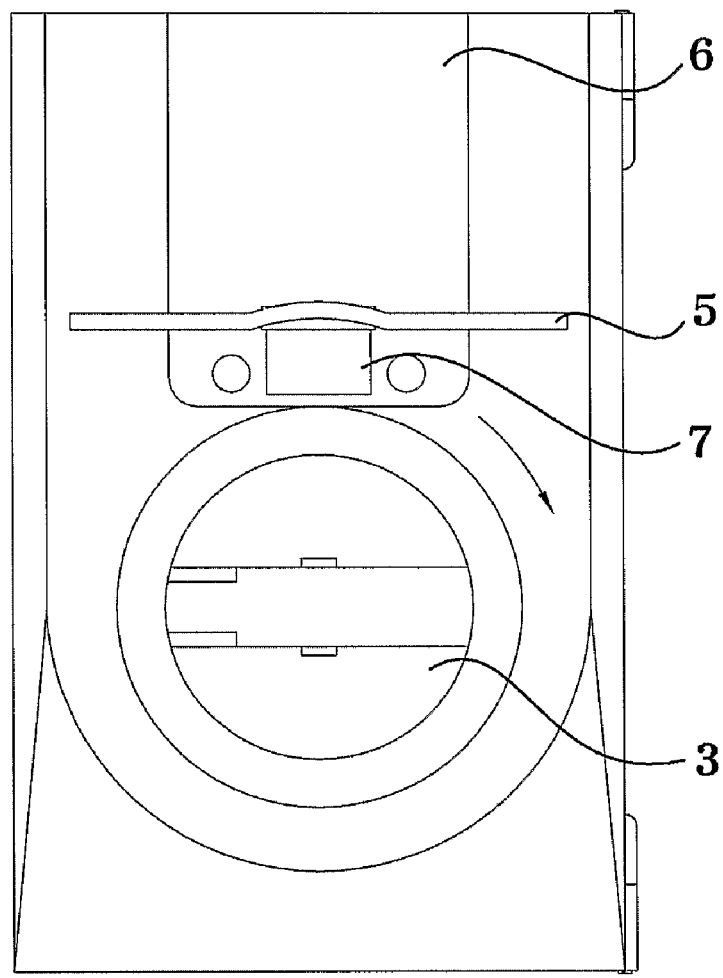
FIG. 20 is a rear view of a portable solar cell charger illustrating polarity change with rotation of a gutter member.

FIG. 19 illustrates a rear view of the solar cell charger according to the present invention when the cover (5) referred to FIG. 14 is unfolded. A gutter member (3) is shown when the cover (5) is unfolded. A wire (9) connected to the portable charger is wound around the gutter member (3). In addition, the gutter member (3) is used to freely change polarities according to an electronic device to be charged. FIG. 20 is a rear view of a portable solar cell charger illustrating polarity change with rotation of a gutter member. Referring to FIG. 20, polarities can be changed when the gutter member (3) is rotated with an angle of ninety degrees. In detail, two copper plates are formed at an interval of 90° on the inside of the case which is in contact with the gutter member (3). Therefore, when the gutter member (3) is rotated, polarities are changed. By adopting such a polarity change method, the solar cell charger according to the present invention is available for various electronic devices which have a different polarity direction of connecting terminal respectively according to manufacturers.

Figure 21:
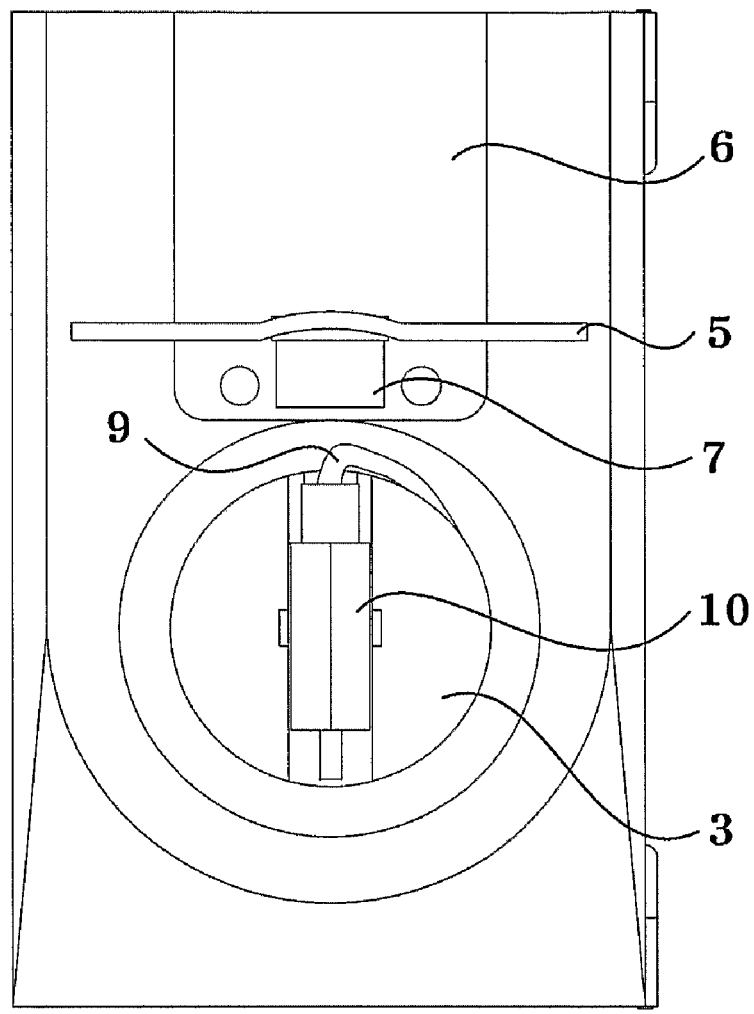
FIG. 21 is a rear view of a portable solar cell charger illustrating a gutter member on which wire is wound.
Figure 22:
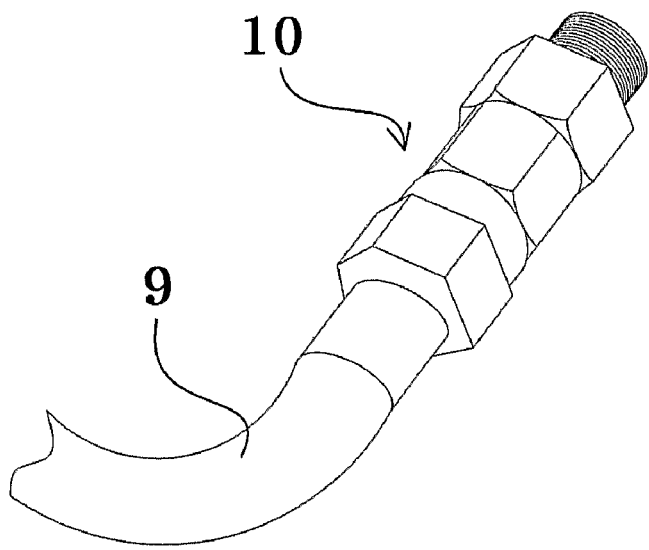
FIGS. 22 through 24 show a connecting member with a slip-type structure in accordance with another embodiment of the present invention.

FIG. 21 is a rear view of a portable solar cell charger illustrating a gutter member (3) on which a wire (9) is wound in accordance with another embodiment of the present invention. Particularly, FIG. 21 shows the rear view of the solar cell charger when the cover (5) is unfolded. Referring to FIG. 21, after the wire (9) is wound around the gutter member (3), a connecting member (10), which connects the charger with an electronic device, is inserted and stored in a holding socket (14). Here, if the connecting member (10) has a general shape, the height of the holding socket (14) increases. Therefore, the size of the solar cell charger increases because of the height of the holding socket (14). To obviate the problem, the connecting member (10) according to the present invention has a slip-type structure so that it has a small external size as shown in FIG. 22.

In addition, the connecting member (10) has a screw-type connection structure so that it can be easily coupled with an electronic device to be charged.

Figure 23:
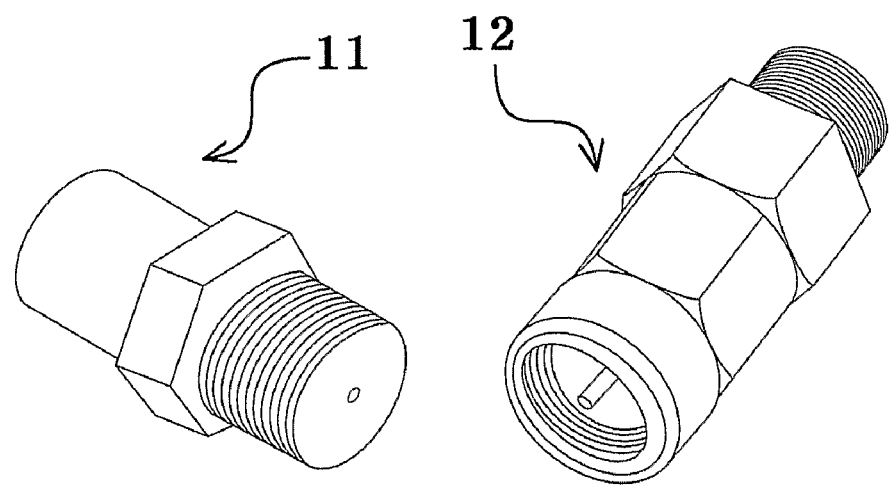
Figure 24:
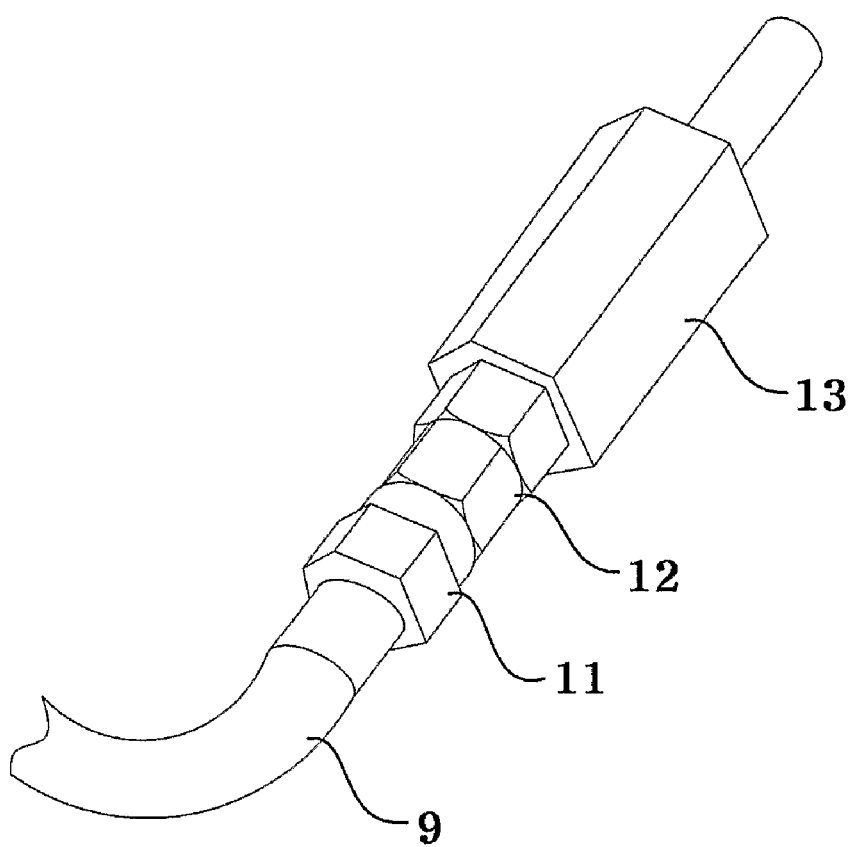

In detail, as shown in FIG. 23, the one end of the wire (9) coupled with a portable charger is formed into a male screw (11) on the center of which a hole is formed. Then, a second connecting part (13), which has a structure suitable for an electronic device to be charged, is prepared. In detail, the one end of the second connecting part (13) is formed into a female screw (12) on the center of which a protrusion is formed. The protrusion is inserted into the hole of the male screw (11). The other end of the second connecting part (13) is formed so as to have a structure suitable for an electronic device to be charged, as shown in FIG. 24.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

INDUSTRIAL APPLICABILITY

By treating the surface of a solar cell plate with a particular material such as polyethylene, the present invention improves the light absorptivity of a portable solar cell charger. Moreover, the solar cell plate according to the present invention has high portability and efficiency owing to a light weight, endurance to external impacts, and a small size.

By adopting a free voltage charging method using a microprocessor, the portable solar cell charger according to the present invention is applicable to various electronic devices. The connecting terminal of the solar cell charger can be easily replaced according to polarities and the shape of the connecting terminal of each electronic device produced by a different manufacturer. By displaying a charging state with an LED or buzzer, a user can easily recognize the charging state. By attaching a connecting wire, a connecting terminal, and a support to the solar cell charger, the charger stably stands up by the support while charging is performed in a stationary state. In addition, by using a tweezer-type holding structure, the solar cell charger is fixed to another object while charging is performed during movement.

The case of the portable solar cell charger according to the present invention is formed of diverse materials such as aluminum or plastics according to the taste of a user. Moreover, by harmonizing the color of solar cells with that of the case, the present invention achieves portable solar cell chargers with diverse designs and beautiful appearance. The solar cell charger according to the present invention can be attached to an existing electronic device so as to embody combined or multifunctional features and be customized into various structures according to users' needs.

By using a cover, the solar cell plate can be aligned at nearly right angle with irradiating line of sunlight. In addition, by using a stopper connected to one end of the cover, the solar cell charger can be fixed to another object while charging is performed during movement. The solar cell charger according to the present invention comprises a gutter member which is rotated to freely change polarities according to an electronic device to be charged. A connecting member to couple the charger with an electronic device is formed into a slip-type structure so as to reduce considerably the volume of the connecting member for storage.

What is claimed is:

1. A portable multi-voltage solar cell charger comprising:
   at least one solar cell plate holding a plurality of solar cells which are molded and arranged in at least one of series or parallel;
   a film formed on the solar cell plate, the film having a reformed surface to reduce reflection of sunlight;
   a power control part supplying a load side with power generated from the solar cells after automatically perceiving a voltage required from the load side; and
   a case holding the solar cell plate and the power control part, the case combining at least one portable electronic device with a charging device,
   wherein the power control part comprises a step-up switching regulator, a step-down switching regulator, and a control circuit, and
   wherein the control circuit comprises:
   an A/D converter perceiving a voltage required from the load side and converting the perceived voltage into a digital value;
   a microprocessor determining the voltage required from the load side using the digital value;
   a D/A converter converting the voltage determined from the microprocessor into an analog value;
   a comparator comparing the analog value from the D/A converter with an output from the solar cell plate; and
   an AND gate integrating a signal from the comparator and a signal from a pulse generator and adjusting the output from the solar cell plate.

2. The portable multi-voltage solar cell charger as defined by claim 1, wherein the solar cells are molded by using a heat resistant polymer, EVA resin.

3. The portable multi-voltage solar cell charger as defined by claim 1, wherein the film formed on the solar cell plate is polymer resin.

4. The portable multi-voltage solar cell charger as defined by claim 1, wherein the film formed on the solar cell plate is treated so that the surface is covered with small pyramid-shaped prominences.

5. The portable multi-voltage solar cell charger as defined by claim 1, wherein the film formed on the solar cell plate is treated so that the surface is covered with small inverted pyramid-shaped prominences.

6. The portable multi-voltage solar cell charger as defined by claim 1, wherein the film formed on the surface of the solar cell plate is treated so that the surface becomes rough as corroded.

7. The portable multi-voltage solar cell charger as defined by claim 1, wherein the step-up switching regulator comprises an n-channel FET (T1), an inductor (L1), and an electrolytic condenser (C1).

8. The portable multi-voltage solar cell charger as defined by claim 1, wherein the step-down switching regulator comprises a p-channel FET (T2), an inductor (L2), and an electrolytic condenser (C2).

9. The portable multi-voltage solar cell charger as defined by claim 1, further comprising a support formed on the back of the case, the support erecting the solar cell plate so that the solar cell plate is directed to incoming light for charging, the support being formed into a tweezer type so that charging is performed during movement.

10. The portable multi-voltage solar cell charger as defined by claim 1, wherein the case has a structure selected from the group of at least one fold, two folds, three folds, and four folds.

11. The portable multi-voltage solar cell charger as defined by claim 1, further comprising a holding member formed on one side of the inside of the case around the solar cell plate, wherein the holding member is made of a magnet.

12. The portable multi-voltage solar cell charger as defined by claim 1, wherein a connecting member is formed on one end of the wire coupled with the portable solar cell charger, the connecting member being formed of a male screw type on the center of which a hole is formed.

13. The portable multi-voltage solar cell charger as defined by claim 12, wherein the connecting member of a male screw type is combined with one end of a second connecting part of a female screw type on the center of which a protrusion is formed.

14. The portable multi-voltage solar cell charger as defined by claim 13, wherein the other end of the second connecting part is formed so as to have a structure suitable for an electronic device to be charged.

15. The portable multi-voltage solar cell charger as defined by claim 1, further comprising a cover formed on the back of the portable solar cell charger, the cover enclosing the gutter member and being used as a support.

16. The portable multi-voltage solar cell charger as defined by claim 15, further comprising a stopper formed on one end of the cover, the stopper being used to support and attach the solar cell charger to another object.

17. A portable multi-voltage solar cell charger comprising:
   at least one solar cell plate holding a plurality of solar cells which are molded and arranged in at least one of series or parallel;

a film formed on the solar cell plate, the film having a reformed surface to reduce reflection of sunlight;

a power control part supplying a load side with power generated from the solar cells after automatically perceiving a voltage required from the load side;

a case holding the solar cell plate and the power control part, the case combining at least one portable electronic device with a charging device; and two copper plates formed at an interval of 90° on the inside of the case which is in contact with the gutter member so that polarities are changed by rotating the gutter member with an angle of 90°, wherein the case comprises a gutter member on which a wire connected to a output terminal of the power control part is wound and stored, wherein the gutter member comprises a disc and is formed so as to be replaced.

18. The portable multi-voltage solar cell charger as defined by claim 17, further comprising a fixing socket in which a connecting member of the wire wound on the gutter member is fitted.

19. A method of charging an electronic device using a portable solar cell charger, comprising:

perceiving a voltage required from a load side on a microprocessor by converting the voltage using an A/D converter;

converting the perceived voltage into a corresponding voltage using a D/A converter and comparing the converted voltage with a voltage from a solar cell plate using a comparator;

integrating a signal from the comparator and a signal from a pulse generator using an AND gate and adjusting the voltage from the solar cell plate based on the integrated signal; and supplying a voltage from the solar cell plate into the load side according to the adjusted voltage.

\* \* \* \* \*